(12) United States Patent
Okawa et al.

(10) Patent No.: US 11,424,714 B2
(45) Date of Patent: Aug. 23, 2022

(54) ANGLED POLYMER SOLAR MODULES

(71) Applicant: SunPower Corporation, San Jose, CA (US)

(72) Inventors: David Okawa, San Bruno, CA (US); Tamir Lance, Los Gatos, CA (US); Gabriela Bunea, San Jose, CA (US); Brian Wares, Sacramento, CA (US); Zachary Judkins, Berkeley, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 0 days.

(21) Appl. No.: 15/965,150

(22) Filed: Apr. 27, 2018

(65) Prior Publication Data
US 2018/0316302 A1 Nov. 1, 2018

Related U.S. Application Data

(60) Provisional application No. 62/491,368, filed on Apr. 28, 2017.

(51) Int. Cl.
*H02S 20/25* (2014.01)
*H01L 31/048* (2014.01)
*H02S 30/00* (2014.01)
*H01L 31/0352* (2006.01)
*H01L 31/049* (2014.01)
*H02S 30/10* (2014.01)
*H02S 20/23* (2014.01)

(52) U.S. Cl.
CPC ...... *H02S 20/25* (2014.12); *H01L 31/035281* (2013.01); *H01L 31/049* (2014.12); *H02S 20/23* (2014.12); *H02S 30/00* (2013.01); *H02S 30/10* (2014.12); *Y02E 10/50* (2013.01)

(58) Field of Classification Search
CPC .......... H02S 20/02; H02S 20/25; H02S 20/26; H02S 30/00; H02S 20/23; H01L 31/048; H01L 31/0488; H01L 31/049; H01L 31/035281
USPC ........................................................ 136/246
See application file for complete search history.

(56) References Cited

U.S. PATENT DOCUMENTS

| | | | | |
|---|---|---|---|---|
| 5,480,494 A | * | 1/1996 | Inoue ..................... | B32B 17/04 136/251 |
| 5,651,837 A | * | 7/1997 | Ohtsuka .............. | H01L 31/0504 136/251 |
| 8,796,061 B2 | | 8/2014 | Bunea | |
| 9,842,951 B2 | | 12/2017 | Sethi et al. | |
| 9,978,896 B2 | | 5/2018 | Sethi et al. | |
| 2007/0012353 A1 | * | 1/2007 | Fischer ................. | H01L 31/048 136/251 |

(Continued)

*Primary Examiner* — Niki Bakhtiari
(74) *Attorney, Agent, or Firm* — Jenkins, Wilson, Taylor & Hunt, P.A.

(57) ABSTRACT

This specification describes angled polymer solar modules, methods for producing angled polymer solar modules, and methods for installing angled polymer solar modules. In some examples, a method includes producing a flat polymer sheet including one or more photovoltaic cells. The method includes applying force to the flat polymer sheet to curve the flat polymer sheet in at least one region, forming an angled polymer sheet from the flat polymer sheet. The method includes mounting the angled polymer sheet on a roof deck such that the photovoltaic cells are angled with respect to the roof deck by virtue of the at least one region being curved.

20 Claims, 15 Drawing Sheets

(56) References Cited

U.S. PATENT DOCUMENTS

| | | | |
|---|---|---|---|
| 2009/0205270 A1* | 8/2009 | Shaw | H02S 20/23 |
| | | | 52/173.3 |
| 2011/0048505 A1 | 3/2011 | Bunea et al. | |
| 2011/0203639 A1* | 8/2011 | Elliott | H02S 20/23 |
| | | | 136/246 |
| 2012/0186632 A1* | 7/2012 | Reinhold | H02S 30/20 |
| | | | 136/251 |
| 2013/0000694 A1 | 1/2013 | Bunea et al. | |
| 2013/0213459 A1* | 8/2013 | Xia | B32B 17/10 |
| | | | 136/251 |
| 2014/0130849 A1* | 5/2014 | Silberschatz | H02S 30/10 |
| | | | 136/251 |
| 2015/0171788 A1 | 6/2015 | Bunea | |
| 2015/0214404 A1* | 7/2015 | Snidow | H02S 30/20 |
| | | | 136/245 |
| 2015/0249175 A1 | 9/2015 | Bunea | |
| 2015/0249426 A1 | 9/2015 | Okawa et al. | |
| 2015/0280643 A1 | 10/2015 | Okawa et al. | |
| 2017/0077332 A1 | 3/2017 | Sethi et al. | |
| 2017/0077343 A1 | 3/2017 | Morad et al. | |
| 2017/0162736 A1 | 6/2017 | Sethi et al. | |
| 2017/0213929 A1 | 7/2017 | Lance et al. | |
| 2017/0330993 A1 | 11/2017 | Sewell et al. | |
| 2018/0006598 A1 | 1/2018 | Bunea | |
| 2018/0033902 A1 | 2/2018 | Caswell et al. | |

\* cited by examiner

ANGLED POLYMER SOLAR MODULES

CROSS-REFERENCE TO RELATED APPLICATIONS

This application claims the benefit of U.S. Provisional Patent Application Ser. No. 62/491,368, filed Apr. 28, 2017, the disclosure of which is incorporated herein by reference in its entirety.

TECHNICAL FIELD

The subject matter described in this specification relates generally to photovoltaic solar systems and in particular to angled polymer solar modules.

BACKGROUND

Photovoltaic (PV) cells, commonly known as solar cells, are devices for converting solar radiation into electrical energy. PV cells can be assembled into solar modules, which may be used to convert sunlight into electricity. A solar energy system typically includes multiple solar modules, racking or mechanical mounting, one or more inverters, and interconnection wiring.

DETAILED DESCRIPTION

This specification describes angled polymer solar modules, methods for producing angled polymer solar modules, and methods for installing angled polymer solar modules. Solar modules typically include rigid structural frames and glass encapsulation, e.g., with a front glass sheet or both front and back glass sheets. Some solar modules are made from polymers and lack a rigid structural frame and glass encapsulation, instead using, e.g., a glassless laminate. In some examples, the angled polymer solar modules described in this specification are light weight in that the panels can be installed on commercial rooftops and other rooftops with low load requirements. A flat orientation for solar modules may result in a poor energy harvest, and the angled polymer solar modules can increase the amount of harvested solar energy by facing the surfaces of the angled polymer solar modules to receive more sunlight.

In general, using polymer solar modules in PV systems can result in improved shipping and logistics compared to solar modules with rigid structural frames and glass encapsulation due to the lower weight of the modules. Furthermore, using polymer solar modules in PV systems may result in reducing installation time, as a result of, e.g., lighter weight, pallet count reduction, and other efficiencies.

Using an angled polymer solar module in PV systems as described in this specification can have one or more of the following advantages in comparison to conventional solar modules: substantial increases in the energy harvest; improved economics for the product (given that the solar modules may be the highest expense in a PV system); enabling the use of the solar modules for cable management off the deck of the roof; improved normal operating condition temperatures for the solar modules since air may flow above and below the modules; and enabling the elimination of racking systems.

Figure 1A:
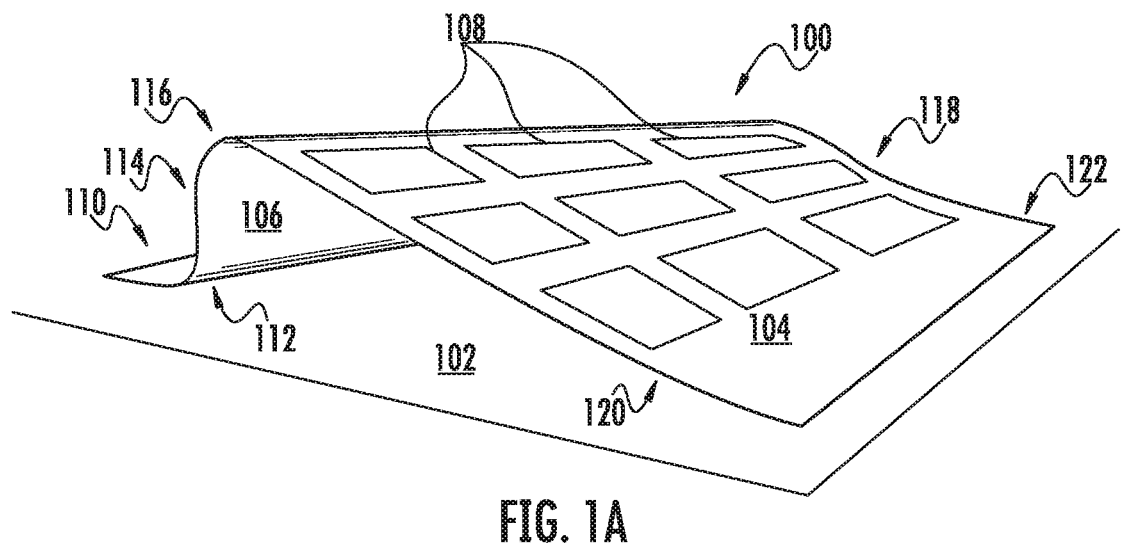
FIGS. 1A-G illustrate example angled polymer solar modules.
Figure 1B:
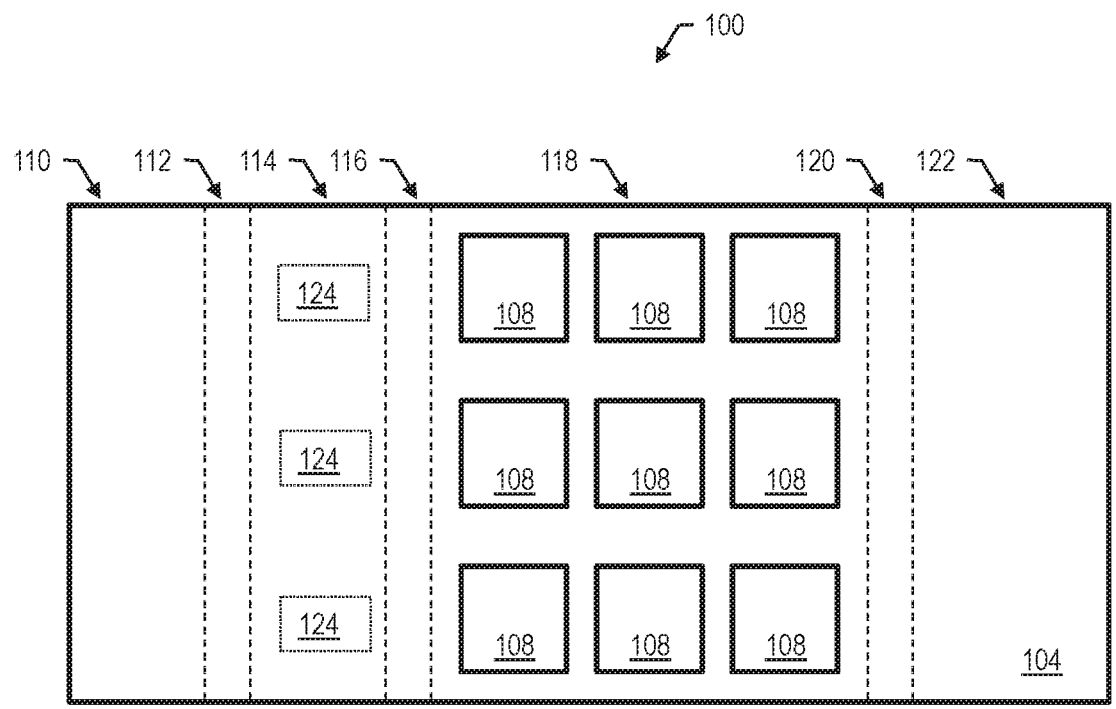
Figure 1C:
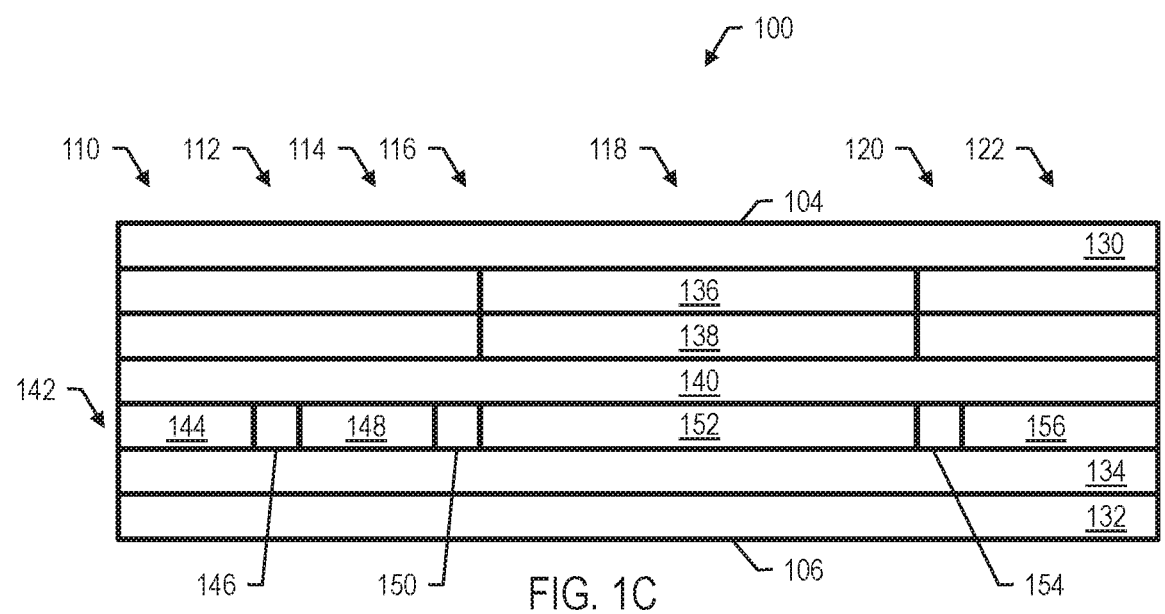

FIGS. 1A-F illustrate example angled polymer solar modules. FIG. 1A shows an isometric view of a solar module 100. FIG. 1B shows a top view of the solar module 100 in a flat configuration, i.e., prior to being angled. FIG. 1C shows a side cross-sectional view of the solar module 100 in the flat configuration.

Referring to FIG. 1A, the solar module 100 is mounted on an example roof deck 102 of a building, e.g., a commercial building with a low load requirement for the roof deck 102, or any other appropriate structure. The roof deck 102, as depicted in the example of FIG. 1A, is flat, i.e., generally parallel to the ground. The solar module 100 can be bonded to the roof deck 102 using any appropriate method, e.g., using adhesive, tape, welding, thermal bonding, mechanical attach, ballasting, or a combination thereof.

The solar module 100 includes a front side 104 and a back side 106. The front side 104 generally faces away from the roof deck 102. The front side 104 includes one or more PV cells 108. The PV cells 108 can have any appropriate semiconductor structure for generating an electrical voltage from sunlight, e.g., front contact, back contact, interdigitated back contact, and the like.

The PV cells 108 are typically encapsulated under transparent or semi-transparent polymer layers, e.g., as described further below with reference to FIG. 1C. FIG. 1A illustrates nine cells in a three-by-three grid; however, in general any appropriate number and orientation of cells may be used. For example, the PV cells can be oriented in a single row of cells.

The solar module 100 is a polymer solar module in that the solar module 100 includes one or more rigid layers of polymer that, in operation, provide rigidity and the overall structural shape of the solar module 100. Since the solar module 100 is a polymer solar module, the solar module 100 need not include a metal frame or other frame for structural support. Although the solar module 100 is formed into the angled shape depicted in FIG. 1A, the solar module 100 may have some flexibility, e.g., so that wind and snow will bend rather than break the solar module 100, and so that handling duration transportation and installation does not break the solar module 100.

The solar module 100, as depicted in the example of FIG. 1A, includes seven distinct regions 110, 112, 114, 116, 118, 120, and 122. The first region 110 is generally parallel to the roof deck 102 and provides surface area for the solar module 100 to be mounted to the roof deck 102. The solar module 100 can be mounted using any appropriate type of fastener(s), e.g., by adhesive, mechanical fasteners such as bolts, or by welding.

The second region 112 curves away from the roof deck 102 and connects the first region 110 to the third region 114. The third region 114 rises generally upwards and away from the roof deck 102, e.g., the third region 114 may be perpendicular or substantially perpendicular to the roof deck 102. The fourth region 116 curves from the third region 114 back around towards the roof deck 102 and connects the third region 114 to the fifth region 118. The fifth region 118 includes the PV cells 108 and slopes from the fourth region 116 down towards the roof deck 102, e.g., the fifth region 118 may slope downward at a constant slope. The sixth region 120 curves upwards from the downward-sloping fifth region 118 to connect the fifth region to the seventh region 122. The seventh region 122 is generally parallel to the roof deck 102 and provides another area for mounting the solar module 100 to the roof deck 102.

Since the roof deck 102 is flat, the solar module 100 is angled so that at least a portion of the solar module 100 including the PV cells 108 can be mounted to the roof deck 102 to face a direction receiving sunlight. For example, if the roof deck 102 is in the northern hemisphere, the solar module 100 can be mounted to the roof deck 102 so that the PV cells 108 generally face upwards towards the south. As depicted in FIG. 1A, the fifth region 118 slopes at an angle with respect to the roof deck 102 and the first and seventh regions 110 and 122.

FIG. 1B shows a top view of the solar module 100 in a flat configuration, i.e., prior to being angled. The solar module 100 may be flat as shown in FIG. 1B after an initial manufacturing stage. The solar module 100 can then later be formed in the angled shape shown in FIG. 1A by any appropriate process. In some examples, the second, fourth, and sixth regions 112, 116, and 120 include one or more thermoplastic layers that are heated so that those regions can be curved as described above with reference to FIG. 1A, and then cooled so that the overall structure of the solar module 100 is generally rigid.

FIG. 1C shows a side cross-sectional view of the solar module 100 in the flat configuration. The solar module 100 includes a number of layers. The layers described below are provided for purposes of illustration; in general, any appropriate structure of PV cells and polymers that provides the solar module 100 with an angled shape can be used.

In this example, the solar module 100 includes a transparent UV-stable front sheet 130, a backsheet 132, and a layer of thermoplastic encapsulant 134. The backsheet 132 can be, e.g., a white backsheet, or a transparent backsheet, or thin glass. In some examples, the backsheet 132 is a patterned backsheet, e.g., generally opaque with a transparent pattern in regions to expose the PV cells 108, e.g., where the PV cells 108 are bifacial.

The thermoplastic encapsulant 134 may be any appropriate type of thermoplastic that becomes pliable above a certain temperature and solidifies upon cooling, e.g., thermoplastic olefin (TPO). Below the transparent front sheet 140, the solar module 100 includes a thermoset encapsulant 136 over a semiconductor layer 138. The thermoset encapsulant 136 can be useful, e.g., to avoid hazing and cell cracking. The semiconductor layer 138 includes the PV cells 108, e.g., one of more PV strings. Below the semiconductor layer 138 is another layer of thermoplastic encapsulant 140.

Between the two layers of thermoplastic encapsulant 134 and 140 is a layer 142 of alternating areas of thermoplastics and rigid polymers. The layer 142 includes rigid polymers sections 144, 148, 152, and 156 in the first, third, fifth, and seventh regions 110, 114, 118, and 122 of the solar module 100. The layer 142 includes thermoplastic sections 146, 150, and 154 in the second, fourth, and sixth regions 112, 116, and 120 of the solar module 100.

As a result of the alternating areas of thermoplastics and rigid polymers in the layer 142, the solar module 100 can be formed as a flat sheet and then be thermally reformed to curve the second, fourth, and sixth regions 112, 116, and 120. Upon cooling, the solar module 100 then forms the angled shape depicted in FIG. 1A. In some examples, flexible metal parts can be incorporated into the laminate (e.g., around the edges of the solar module 100) to further control the angled shape of the solar module 100.

In some examples, the solar module 100 includes in-laminate diodes 124 in the electrical connections of the solar module 100. For example, the solar module 100 can include in-laminate diodes 124 in the third region 114 of the solar module, which becomes a vertical face when installed on a flat roof deck. The in-laminate diodes 124 can be useful, e.g., to minimize temperature increase near the solar cells 108.

FIG. 1C illustrates a layer 142 of alternating areas of thermoplastics and rigid polymers; however, in some examples, the solar module 100 lacks these alternating areas. For example, the solar module 100 may include layers of thermoplastics that are uniform. In that case, the solar module 100 can be heated and then shaped, e.g., by pressing the solar module 100 against a mold, and then cooled to form the angled shape depicted in FIG. 1A.

Figure 1D:
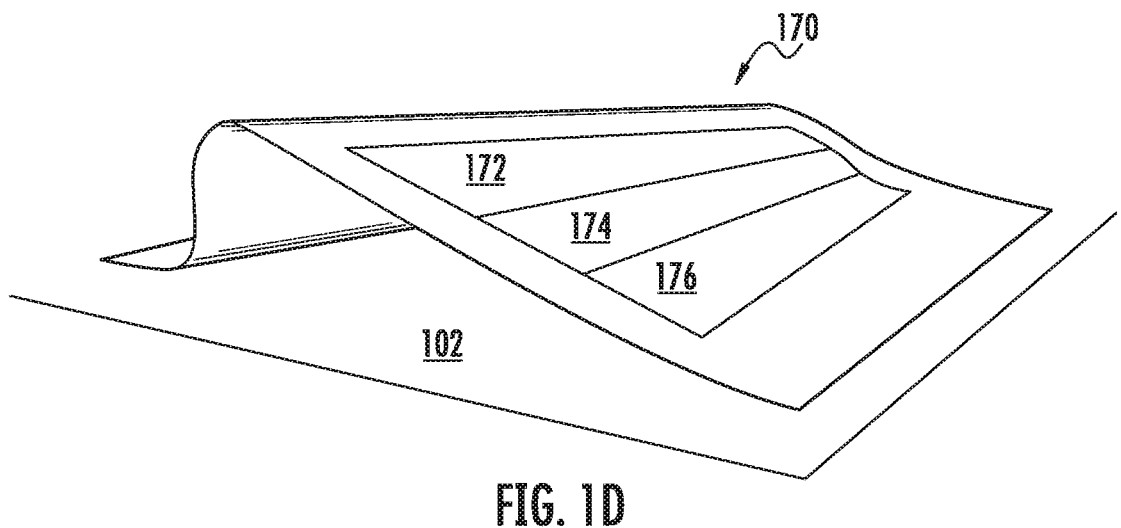

FIGS. 1A-B illustrate the solar module 170 with generally square PV cells 108. In general, the PV cells 108 can have any appropriate shape. FIG. 1D illustrates an alternative example solar module 170 having a number of shingled solar strips 172, 174, and 176 arranged in a shingled manner with the ends or long edges of adjacent solar strips overlapping and electrically connected to form, e.g., a series-connected string.

Adjacent solar cells are conductively bonded to each other in the region in which they overlap by an electrically conducting bonding material. In an example, although only one row of shingled solar strips 172 is shown, multiple shingled solar strips 172 can be used (e.g., multiple shingled solar cell strips can be positioned, side by side, at the same time, e.g., to increase an output rate or to produce wider PV sheets). In some examples, the one shingled solar cell strip can be connected to another shingled solar cell strip in parallel.

Figure 1E:
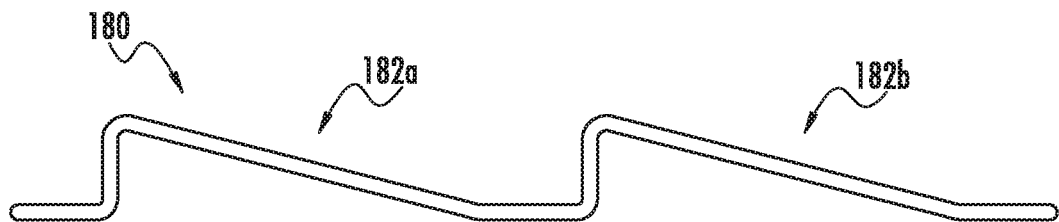

FIG. 1E is a side view an example solar module 180 having multiple angled waves 182a-b in a single laminate. Each of the angled waves 182a-b includes a raised, angled portion of laminate with solar cells, e.g., as described above with reference to FIGS. 1A-D. The single laminate can be manufactured as a single flat sheet and then thermally formed. Although the example solar module 180 is illustrated in FIG. 1E as having two angled waves 182a-b, in general, the solar module 180 can have any desirable number of angled waves formed in a single laminate structure.

Figure 1F:
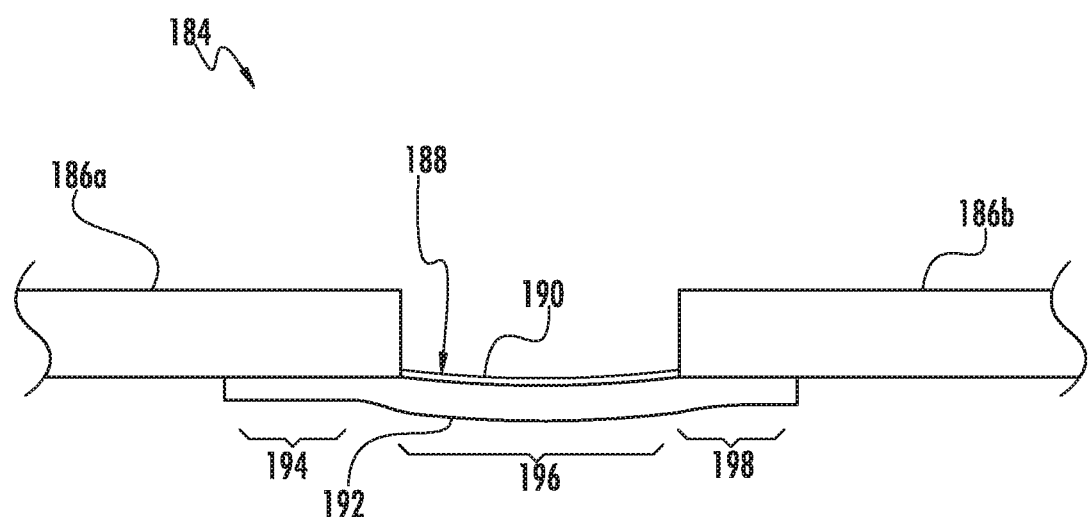

FIG. 1F is a side view of a portion of a solar module 184 having two laminate sections 186a-b joined together by a hinge 188. One or more electrical wires 190 can electrically couple solar cells from the first laminate section 186a to the second laminate section 186b. In some examples, each of the laminate sections 186a-b can be an entire angled solar module, e.g., as described above with reference to FIGS. 1A-E.

In some other examples, the hinge 188 is included to implement the angled structure of the solar modules of FIGS. 1A-E, i.e., such that the hinge 188 replaces a curved portion of the laminate structure (e.g., one or more of the second, fourth, and sixth regions 112, 116, and 120 illustrated in FIG. 1B.) For example, the first laminate section 186a can be the first region 110, the second laminate section 186b can be the third region 114, and the hinge 188 can replace the second region 112. In that case, a rigid or semi-rigid bracket can be secured (e.g., clipped to the side) to the solar module to fix the angled shape of the solar module.

The hinge 188 can include a flexible strap 192. The flexible strap 192 includes a first leaf 194 secured to the first laminate section 186*a*, a central portion 196 that spans a gap between the two laminate sections 186*a-b*, and a second leaf 198 secured to the second laminate section 186*b*. The flexible strap 192 allows the two laminate sections 186*a-b* to move relative to another, which can be useful, e.g., for forming an angled solar module or for storage or transport of solar modules.

In some examples, the solar modules illustrated in FIGS. 1A-E are sized for residential or commercial rooftop installation. For example, for some residential rooftop applications, the solar modules have about 96 solar cells and are configured, by virtue of materials selection and appropriate dimensions, to weigh about 8 kg. In another example, for some commercial rooftop applications, the solar modules have about 126 solar cells and are configured, by virtue of materials selection and appropriate dimensions, to weigh about 10.5 kg. The weight would double for solar modules having two angled waves, e.g., the solar module 180 of FIG. 1E.

The solar modules can be configured such that, at each angle, the radius of curvature of the curve between two sections is at least large enough to allow ribbons to pass through the curve. For example, the solar modules can be configured such that, at the curve between the fourth section 116 and the fifth section 118, the radius of curvature is large enough to allow ribbons to pass through the curve. The minimum radius of curvature can be, e.g., 7.5 mm.

Figure 1G:
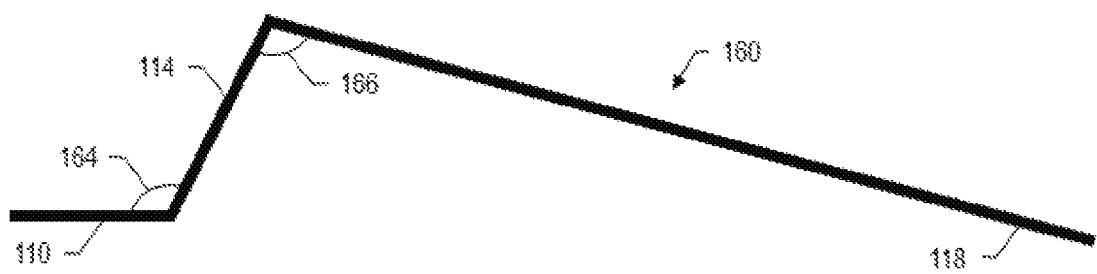
Figure 1G:
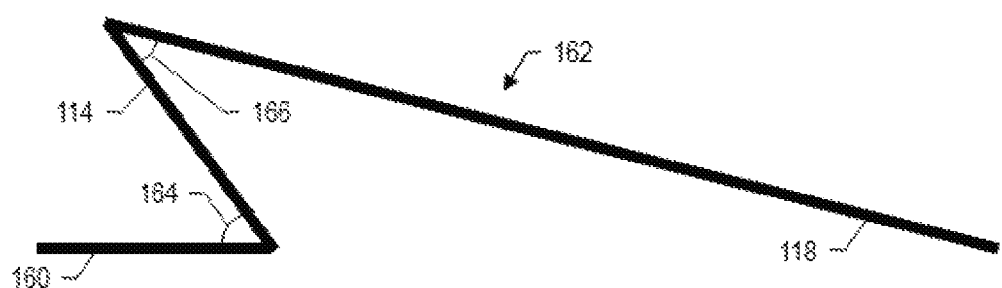

FIG. 1G shows two example shapes 160 and 162 of angled solar modules. The first shape 160 corresponds to the shape of the solar module 100 of FIG. 1A. The angle 164 between the first region 110 and the third region 114 is greater than or equal to 90 degrees. The angle 166 between the third region 114 and the fifth region 118 is also greater than or equal to 90 degrees. The second shape 162 differs from the first shape 160 in that the angle 164 between the first region 110 and the third region 114 is less than 90 degrees, and the angle 166 between the third region 114 and the fifth region 118 is also less than 90 degrees. Angled solar modules having the second shape 162 can be useful, e.g., so that the solar module can act as a spring and provide overall flexibility of the solar module.

Figure 2A:
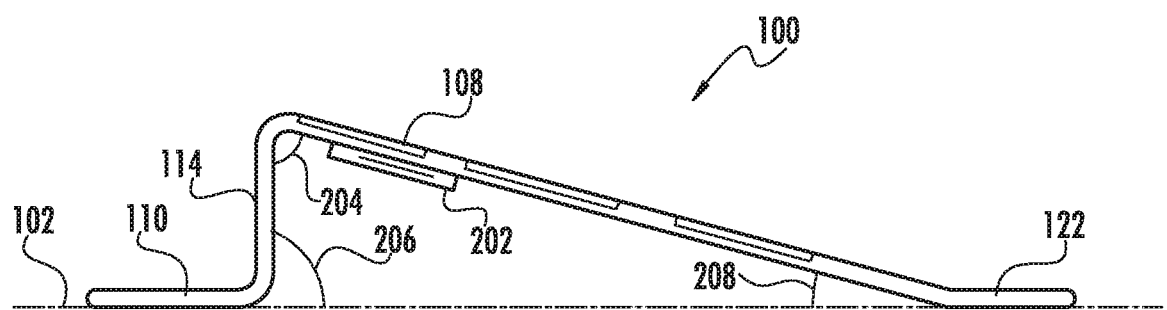
FIGS. 2A-D illustrate optional features that can be realized using angled solar modules.

FIGS. 2A-D illustrate optional features that can be realized using angled solar modules, e.g., the solar modules of FIGS. 1A-G. FIG. 2A is a side view of the solar module 100 having power electronics 202 mounted on the back side 106 of the solar module 100 and electrical cabling 204 that runs underneath the solar module 100. The power electronics 202 and the electrical cabling 204 are kept off the roof deck 102 in the space under the solar module 100 and protected from some environmental elements by the solar module 100. The power electronics 202 can include, e.g., a junction box, a microinverter, a DC optimizer, or one or more of any appropriate electronics modules.

Additional spaces underneath the solar module 100 or at the feet 110 and 122 of the solar module 100 can be used for other components of a PV system in some examples. The solar module 100 can be angled with respect to the roof deck 102 at any appropriate angle; for example, the angles 206 and 208 between the roof deck 102 and the solar module may be selected based on a geographic location to improve energy harvesting from the sun.

Figure 2B:
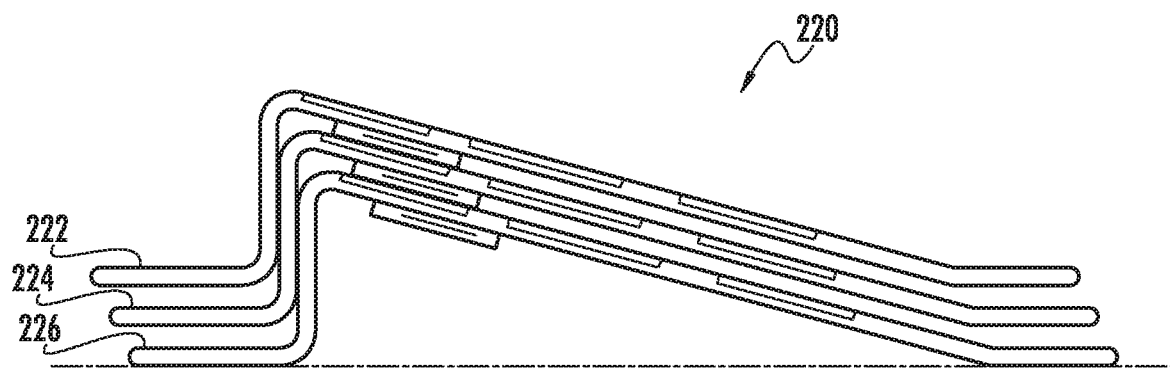

FIG. 2B is a side view of a number of solar modules 222, 224, and 226 in a stacked configuration 220. The solar modules 222, 224, and 226 can be stacked, e.g., for transportation and storage and then unstacked for installation.

Figure 2C:
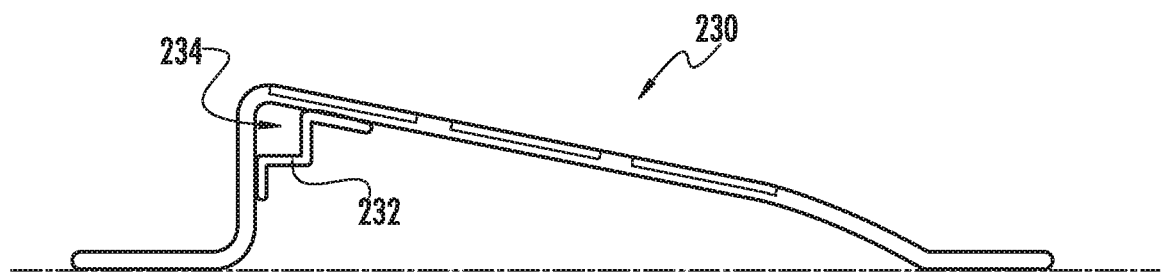

FIG. 2C is a side view of solar module 230 having an under-side structure 232 forming a slot 234 for cable retention, e.g., a laminated slot formed with the other laminated structures of the solar module 230. In an example, the slot 234 can hold cables, electronics or any component, which can fit into or can be held by the slot 234.

Figure 2D:
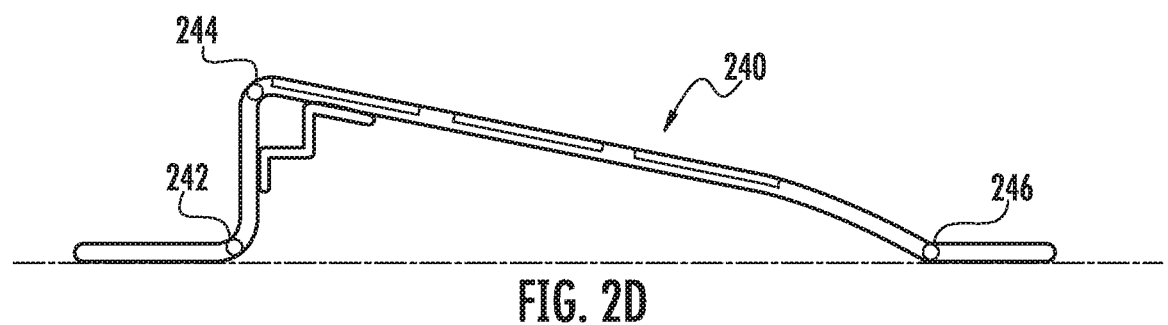

FIG. 2D is a side view of a solar module 240 including rigidifying elements 242, 244, and 246 inserted or clipped on to the edge of the laminate structure to lock the angles between the laminate sections. The rigidifying elements 242, 244, and 246 can be formed of any appropriate material that is more rigid than the thermoplastic sections. For example, the rigidifying elements 242, 244, and 246 can be metal or plastic rods or bars that span some or all of the width of the solar module 240.

Figure 3A:
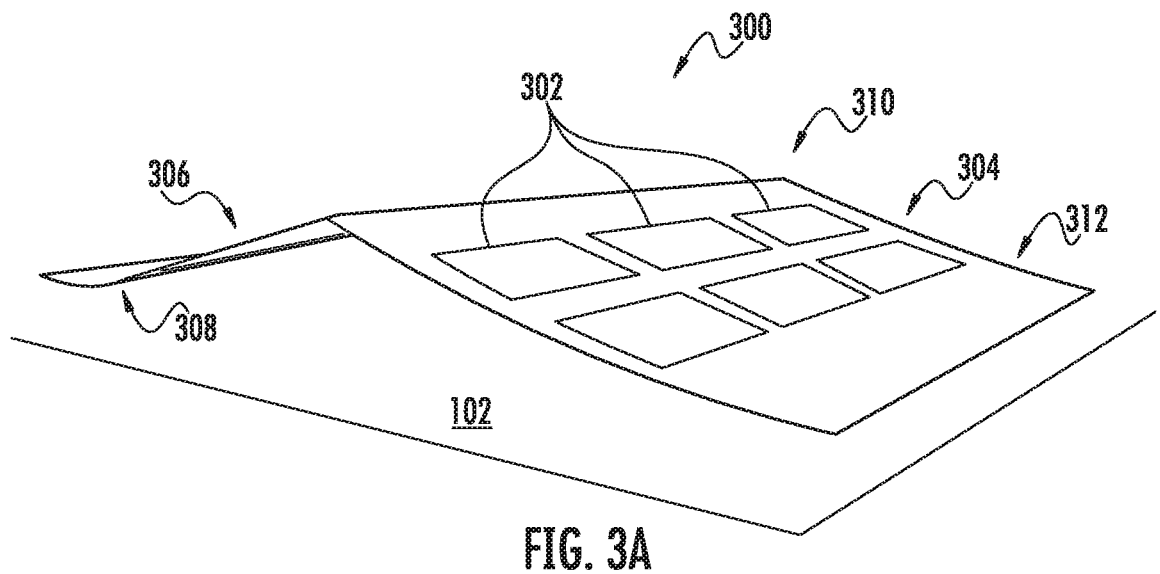
FIGS. 3A-B illustrate an example angled polymer solar module.
Figure 3B:
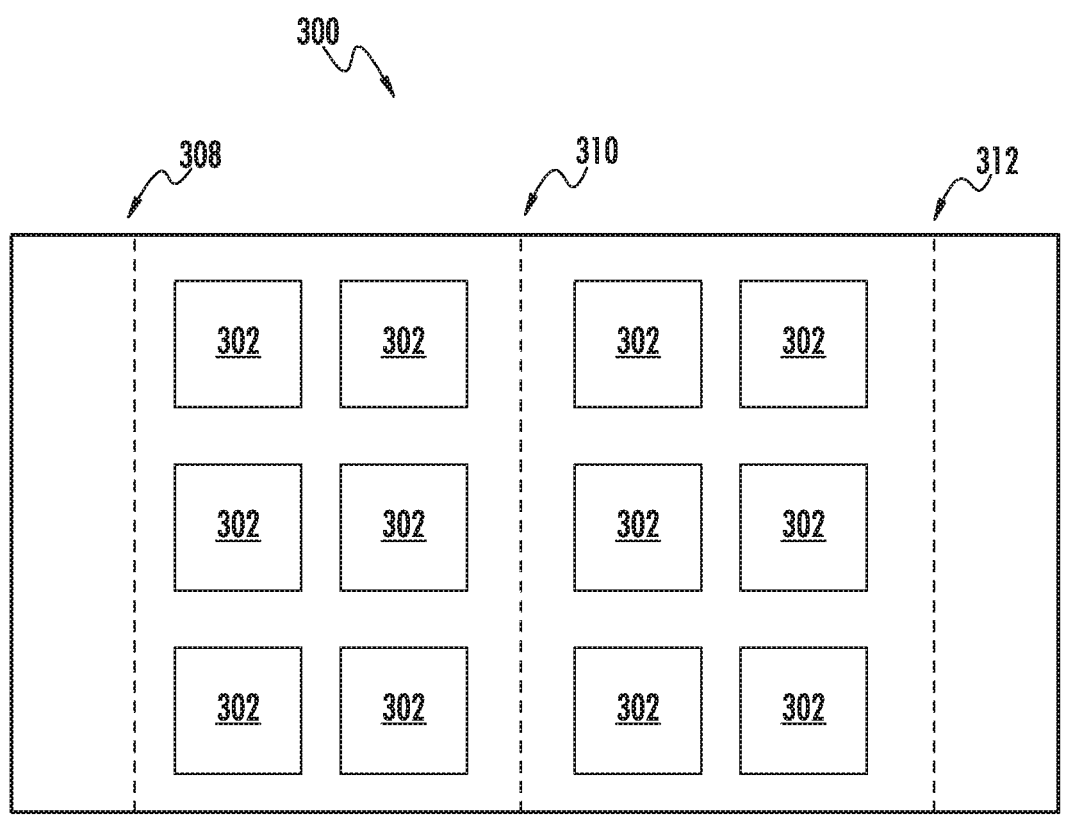

FIGS. 3A-B illustrate an example angled polymer solar module 300. FIG. 3A shows an isometric view of the solar module 300. FIG. 3B shows a top view of the solar module 300 in a flat configuration, i.e., prior to being angled.

The solar module 300 is mounted on a roof deck 102 and in some examples is formed of a laminated structure, e.g., as described above with reference to FIG. 1C. The solar module 300 includes one or more PV cells 302 on first and second angled surfaces 304 and 306. The first and second angled surfaces 304 and 306 face upwards and away from the roof deck 102 in opposite directions, e.g., so that the solar module 300 receives sun exposure at a variety of different times and seasons. The solar module 300 angles at three different regions 308, 310, and 312, for example, by virtue of thermoplastic materials in those regions 308, 310, and 312.

Figure 4A:
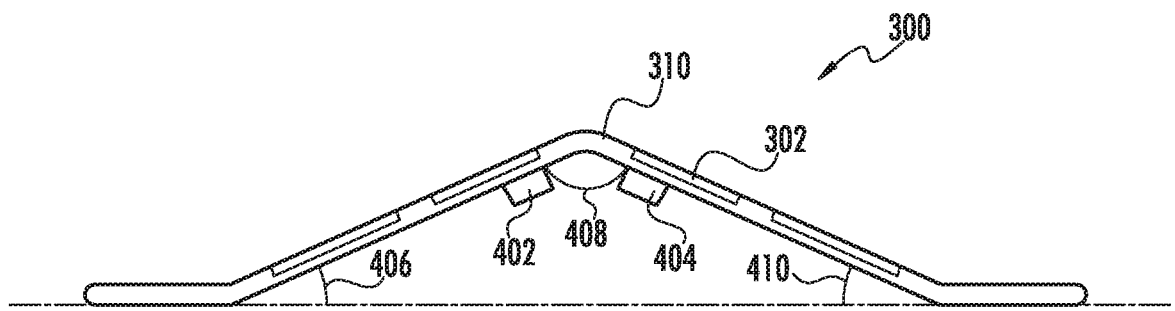
FIGS. 4A-C illustrate optional features that can be realized using the solar module of FIGS. 3A-B.
Figure 4B:
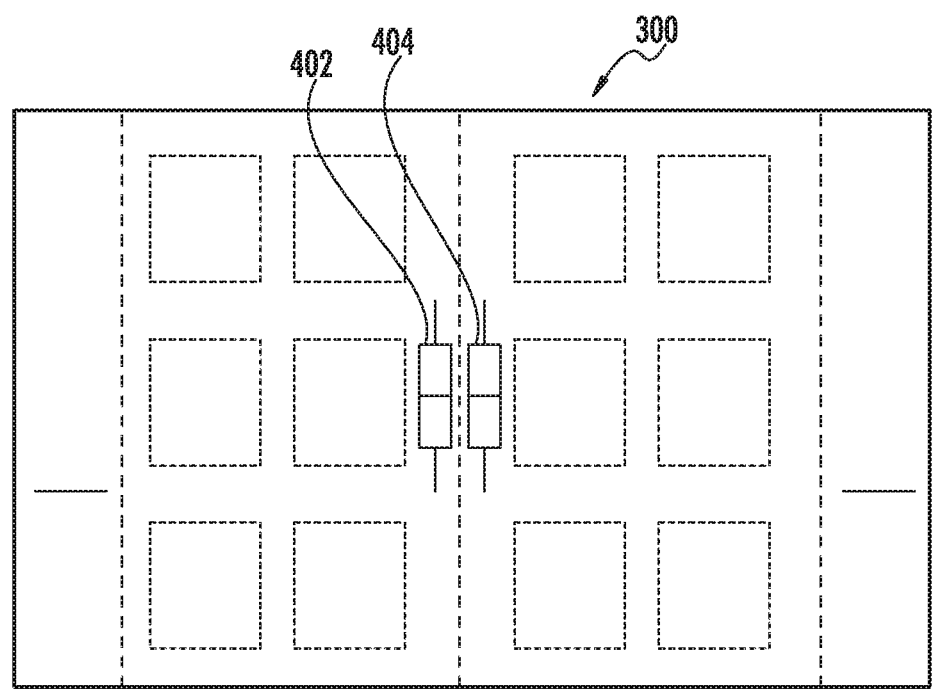
Figure 4C:
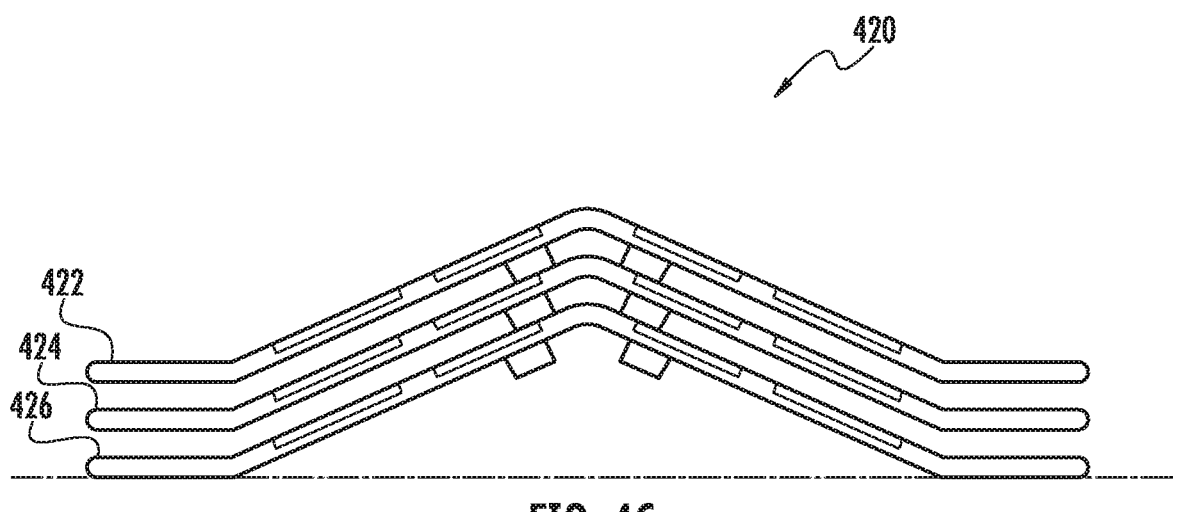

FIGS. 4A-C illustrate optional features that can be realized using the solar module 300 of FIGS. 3A-B. FIG. 4A is a side view of the solar module 300 having power electronics (e.g., junction boxes 402 and 404) mounted on the underside of the solar module 300 and electrical cabling 408 that runs underneath the solar module 300. FIG. 4B is a bottom view of the solar module 300 in a flat configuration showing the junction boxes 402 and 404 mounted on the underside of the solar module 300. FIG. 4C is a side view of a number of solar modules 422, 424, and 426 in a stacked configuration 420, which can be useful, e.g., for transportation and storage.

The first junction box 402 may serve PV cells on the one angled surface 304 and the second junction box may serve PV cells on the other angled surface 306. The junction boxes 402 and 404 and the electrical cabling 408 are kept off of the roof deck 102 in the space under the solar module 300 and protected from some environmental elements by the solar module 300. Additional spaces underneath the solar module 300 and at the feet of the solar module 300 can be used for other components of a PV system, e.g., flexible wiring, in some examples. The solar module 300 can be angled with respect to the roof deck 102 at any appropriate angle; for example, the angles 406 and 408 between the roof deck 102 and the solar module may be selected based on a geographic location to improve energy harvesting from the sun.

Figure 5:
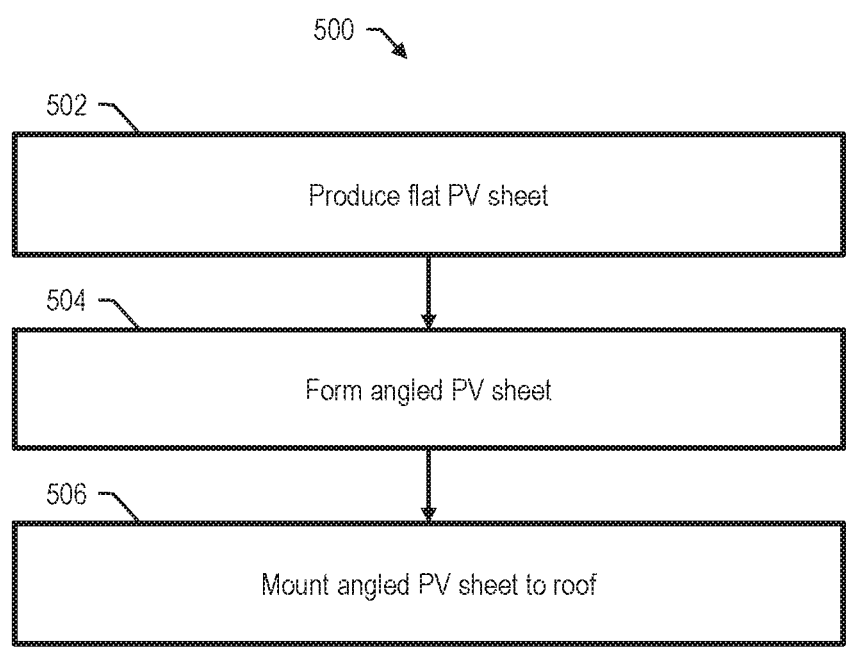
FIG. 5 is a flow diagram of an example method for manufacturing one or more angled polymer solar modules.

FIG. 5 is a flow diagram of an example method 500 for manufacturing one or more angled polymer solar modules, e.g., the solar modules 100 and 300 of FIGS. 1A-C and 3A-B. The method 500 can be performed by one or more operators or by an appropriately programmed robot or automation machinery or both.

The method 500 includes producing a flat PV sheet (502), forming the flat PV sheet into an angled PV sheet (504), and mounting the angled PV sheet on a roof (506). The flat PV sheet may be a laminated structure. The flat PV sheet is substantially flat, in that the flat PV sheet may not be perfectly flat as a result of, e.g., manufacturing artifacts or certain features that extend away from the flat PV sheet or cause a relatively small degree of bending the flat PV sheet.

For example, the method 500 can include laminating a flat PV sheet (e.g., as shown in FIG. 1C) and then locally reforming thermoplastic polymers by application of heat and then bending forces to give the PV sheet the angled shape. In another example, the method 500 includes laminating a flat PV sheet and then using constraining pieces (e.g., by applying force to the full sheet against the constraining pieces) to give the PV sheet the angled shape. In another example, the method 500 includes laminating a flat PV sheet and then attaching the PV sheet to an angled plastic feature to give the PV sheet the angled shape.

Figure 6:
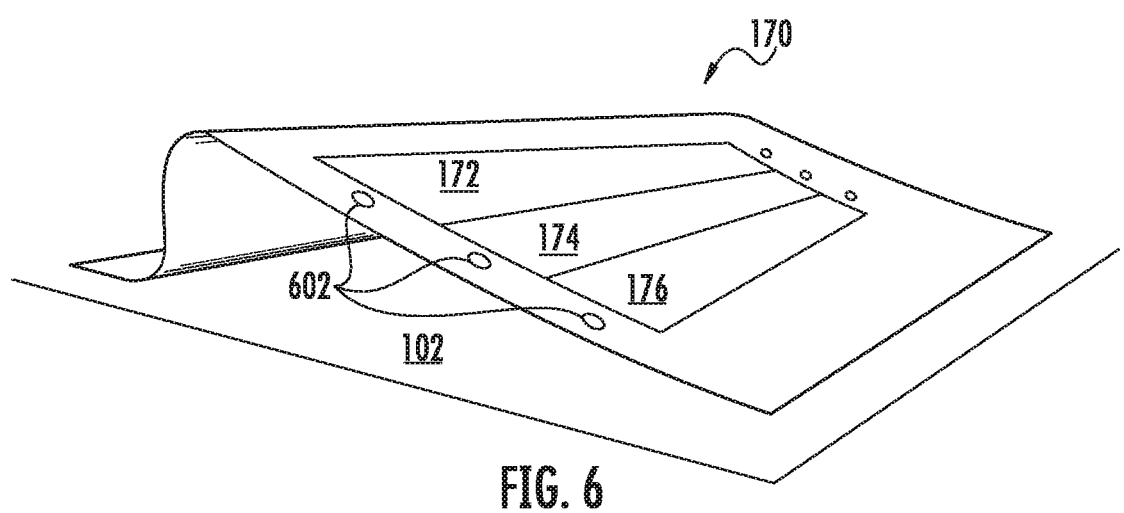
FIG. 6 shows the solar module of FIG. 1D with holes patterned onto the sides of the solar module.

In some examples, the solar modules 100 and 170 can include features for wind management, e.g., to reduce the ability of wind to alter the angled structure of the solar modules 100 and 170 or to reduce the ability of wind to pull the solar modules 100 and 170 off of the roof deck 102 or both. For example, FIG. 6 shows the solar module 170 of FIG. 1D with holes 602 patterned onto the sides of the solar module 170 to allow wind to pass through the solar module 170. In an example, the holes 602 can have a circular, square, rectangular, polygonal or any shape to allow wind to pass through the solar module 170. In some embodiments, the holes 602 can be slits, e.g., thin vertical or horizontally positioned rectangular shapes.

Figure 7A:
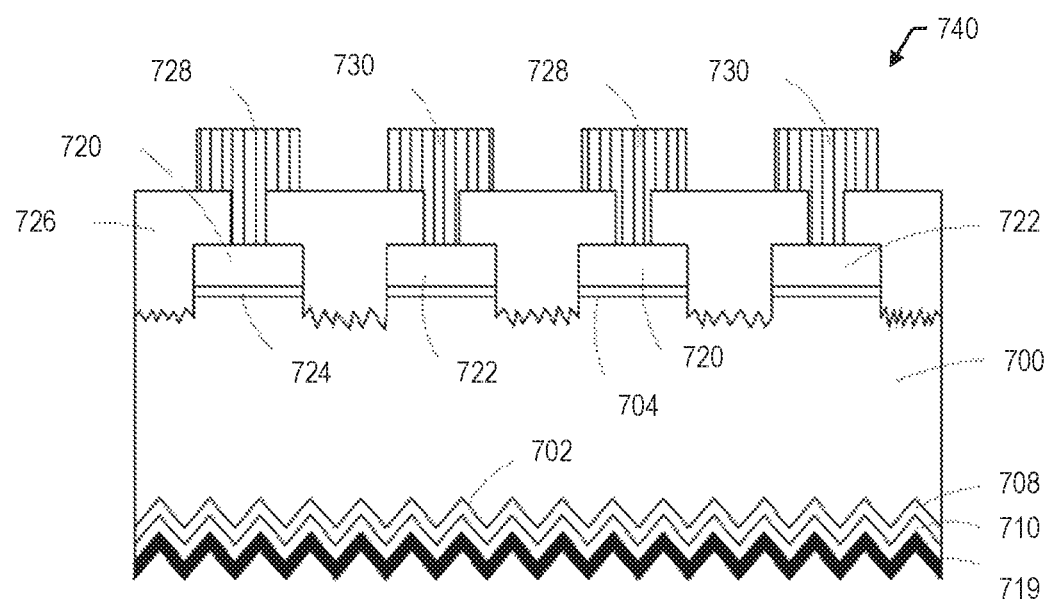
FIGS. 7A-C illustrate example photovoltaic devices.
Figure 7B:
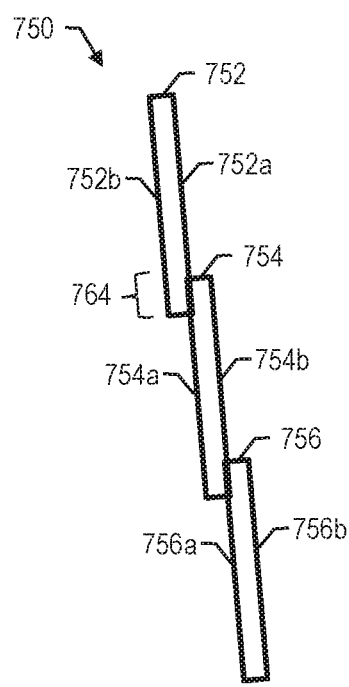
Figure 7C:
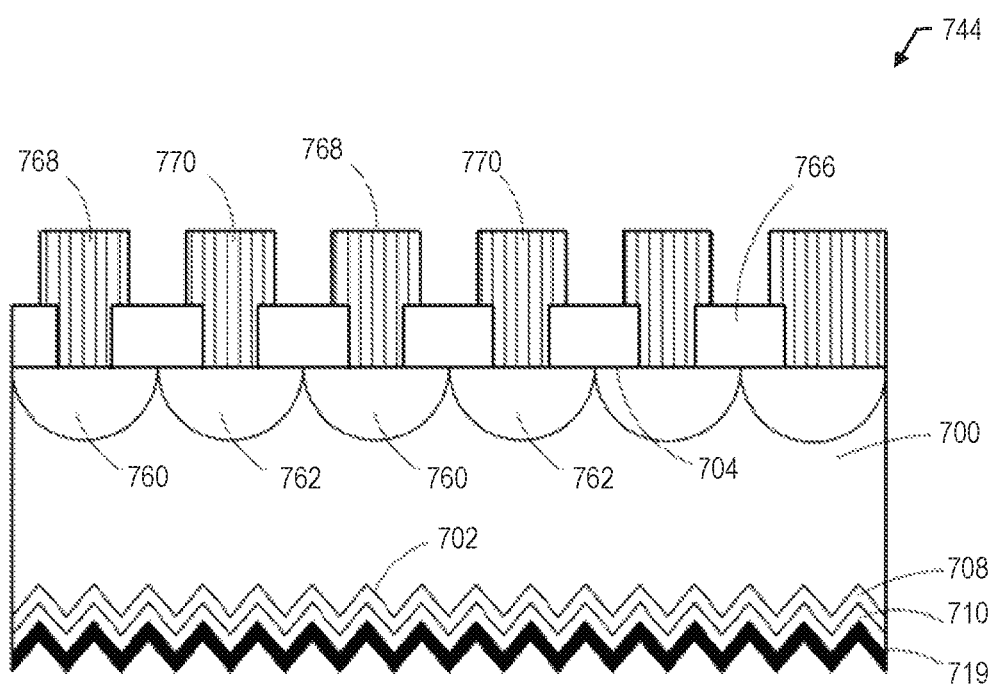

FIGS. 7A-C illustrate example PV devices that can be used as PV cells in the solar modules described in this specification. In general, the solar modules can include any appropriate type of PV device, and FIGS. 7A-C are provided for purposes of illustration.

FIG. 7A illustrates a cross-sectional view of a back-contact solar cell 740 having emitter regions formed above a back surface of a substrate.

The solar cell 740 includes a silicon substrate 700 having a light-receiving surface 702. A passivating dielectric layer 708 is disposed on the light-receiving surface 702 of the silicon substrate 700. An optional intermediate material layer (or layers) 710 is disposed on the passivating dielectric layer 708. An Anti-Reflective Layer (ARC) layer 719 is disposed on the optional intermediate material layer (or layers) 710, as shown, or is disposed on the passivating dielectric layer 708.

On the back surface of the substrate 700, alternating P-type 720 and N-type 722 emitter regions are formed. In one such embodiment, trenches 721 are disposed between the alternating P-type 720 and N-type 722 emitter regions. More particularly, in an embodiment, first polycrystalline silicon emitter regions 722 are formed on a first portion of a thin dielectric layer 724 and are doped with an N-type impurity. Second polycrystalline silicon emitter regions 720 are formed on a second portion of the thin dielectric layer 724 and are doped with a P-type impurity. In an embodiment the tunnel dielectric 724 is a silicon oxide layer having a thickness of approximately 2 nanometers or less.

Conductive contact structures 728/730 are fabricated by first depositing and patterning an insulating layer 726 to have openings and then forming one or more conductive layers in the openings. In an embodiment, the conductive contact structures 728/730 include metal and are formed by a deposition, lithographic, and etch approach or, alternatively, a printing or plating process or, alternatively, a foil or wire adhesion process.

FIG. 7B an example solar device 750 of solar cells arranged in a shingled manner with the ends of adjacent solar cells overlapping. FIG. 7B shows a side view of the solar device 750 that illustrates the orientation of the solar device 750 towards the sun (or other light source such as mirrors facing the sun). The solar device 750 may be referred to as a "supercell" or a "hypercell" or a "solar cell strip."

The solar device 750 includes solar cells 752, 754, and 756 arranged in a shingled manner with the ends or long edges of adjacent solar cells overlapping and electrically connected to form, e.g., a series-connected string. Each solar cell 102, 104, and 106 can include a semiconductor diode structure and electrical contacts to the semiconductor diode structure. Adjacent solar cells are conductively bonded to each other in the region in which they overlap by an electrically conducting bonding material that electrically connects the front surface metallization structure of one solar cell to the rear surface metallization structure of the adjacent solar cell.

For example, consider the first and second solar cells 752 and 752 in the solar device 750. The second solar cell 754 is adjacent to the first solar cell 752 and overlaps the first solar cell 752 in a region 764 where the first and second solar cells 752 and 754 are electrically connected.

Appropriate electrically conducting bonding materials may include, for example, electrically conducting adhesives and electrically conducting adhesive films and adhesive tapes, and conventional solders. In some examples, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon).

FIG. 7C illustrates a cross-sectional view of a back-contact solar cell 744 having emitter regions formed in a back surface of a substrate and having a UV-cured and thermally annealed ARC layer at a light-receiving surface of the substrate, in accordance with an embodiment of the present disclosure.

The solar cell 744 includes a silicon substrate 700 having a light-receiving surface 702. A passivating dielectric layer 708 is disposed on the light-receiving surface of the silicon substrate 700. An optional intermediate material layer (or layers) 710 is disposed on the passivating dielectric layer 708. An ARC layer 719 is disposed on the optional intermediate material layer (or layers) 710, as shown, or is disposed on the passivating dielectric layer 708. In one embodiment, the ARC layer 719 is a UV-radiation-cured and thermally annealed ARC layer.

Within the back surface of the substrate 700, alternating P-type 760 and N-type 762 emitter regions are formed. More particularly, in an embodiment, first emitter regions 762 are formed within a first portion of substrate 700 and are doped with an N-type impurity. Second emitter regions 760 are formed within a second portion of substrate 700 and are doped with a P-type impurity. Conductive contact structures 768/770 are fabricated by first depositing and patterning an insulating layer to have openings and then forming one or more conductive layers in the openings. In an embodiment, the conductive contact structures 768/770 include metal and are formed by a deposition, lithographic, and etch approach or, alternatively, a printing or plating process or, alternatively, a foil or wire adhesion process.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A solar module comprising:
   one or more layers of polymer; and
   one or more photovoltaic cells over a first region of the one or more layers of polymer;
   wherein the one or more layers of polymer are curved in at least a second region outside of the first region of the one or more photovoltaic cells;
   wherein the solar module comprises a transparent front sheet, a backsheet, and a layer of alternating sections of a rigid or semi-rigid polymer and a thermoplastic, wherein the layer of alternating sections is alternating between the rigid or semi-rigid polymer and the thermoplastic in a direction from the first region to the second region;
   wherein the layer of alternating sections includes at least a first section of the rigid or semi-rigid polymer for the first region and a first section of the thermoplastic for the second region where the one or more layers of polymer are curved; and
   wherein the layer of alternating sections is sandwiched between a first thermoplastic layer and a second thermoplastic layer.

2. The solar module of claim 1, comprising a first flat region, a vertical region rising from the first flat region, a downward-sloping region of the first region sloping away from the vertical region and including the one or more photovoltaic cells, and a second flat region extending away from the downward-sloping region, and wherein the layer of alternating sections comprises:
   a respective rigid section for each of the first flat region, the downward-sloping region, and the second flat region; and
   a respective thermoplastic section for each of:
      a first junction between the first flat region and the downward-sloping region; and
      a second junction between the down-ward sloping region and the second flat region.

3. The solar module of claim 2, comprising a second vertical region rising from the second flat region, a second downward-sloping region sloping away from the second vertical region and including a plurality of additional photovoltaic cells, and a third flat region extending away from the second downward-sloping region.

4. The solar module of claim 2, wherein a first angle between the first flat region and the vertical region is less than 90 degrees, and wherein a second angle between the vertical region and the downward-sloping region is less than 90 degrees.

5. The solar module of claim 1, comprising a first flat region, an upward-sloping region sloping upwards from the first flat region and including a first subset of the one or more photovoltaic cells, a downward-sloping region sloping downwards from the upward-sloping region and including a second subset of the one or more photovoltaic cells, and a second flat region extending away from the downward-sloping region.

6. The solar module of claim 1, comprising power electronics mounted to the second region.

7. The solar module of claim 1, wherein the layer of alternating sections comprises a first section of the rigid or semi-rigid polymer, a second section of the thermoplastic adjacent to the first section, and a third section of the rigid or semi-rigid polymer adjacent to the second section.

8. The solar module of claim 1, comprising one or more in-laminate diodes in the one or more layers of polymer.

9. The solar module of claim 1, wherein a plurality of holes are patterned through the solar module to allow wind to pass through the solar module.

10. The solar module of claim 1, comprising a hinge joining a first section of the solar module and a second section of the solar module.

11. A system comprising:
    a first solar module; and
    one or more second solar modules stacked on top of the first solar module, wherein each of the first solar module and the one or more second solar modules comprises:
       one or more layers of polymer;
       one or more photovoltaic cells over a first region of the one or more layers of polymer; and
       a transparent front sheet, a backsheet, and a layer of alternating sections of a rigid or semi-rigid polymer and a thermoplastic;
       wherein the one or more layers of polymer are curved in at least a second region outside of the first region of the one or more photovoltaic cells, and wherein the layer of alternating sections is alternating between the rigid or semi-rigid polymer and the thermoplastic in a direction from the first region to the second region; and
       wherein the layer of alternating sections includes at least a first section of the rigid or semi-rigid polymer for the first region and a first section of the thermoplastic for the second region where the one or more layers of polymer are curved; and
       wherein the layer of alternating sections is sandwiched between a first thermoplastic layer and a second thermoplastic layer.

12. The system of claim 11, wherein each of the first solar module and the one or more second solar modules comprises a first flat region, a vertical region rising from the first flat region, a downward-sloping region of the first region sloping away from the vertical region and including the photovoltaic cells, and a second flat region extending away from the downward-sloping region, and wherein the layer of alternating sections of each of the first solar module and the one or more solar modules comprises:
    a respective rigid section for each of the first flat region, the downward-sloping region, and the second flat region; and a respective thermoplastic section for each of:
a first junction between the first flat region and the downward-sloping region; and
a second junction between the down-ward sloping region and the second flat region.

13. The system of claim 12, wherein each of the first solar module and the one or more second solar modules comprises a second vertical region rising from the second flat region, a second downward-sloping region sloping away from the second vertical region and including a plurality of additional photovoltaic cells, and a third flat region extending away from the second downward-sloping region.

14. The system of claim 12, wherein, for each of the first solar module and the one or more second solar modules, a first angle between the first flat region and the vertical region is less than 90 degrees, and wherein a second angle between the vertical region and the downward-sloping region is less than 90 degrees.

15. The system of claim 11, wherein each of the first solar module and the one or more second solar modules comprises a first flat region, an upward-sloping region sloping upwards from the first flat region and including a first subset of the one or more photovoltaic cells, a downward-sloping region sloping downwards from the upward-sloping region and including a second subset of the one or more photovoltaic cells, and a second flat region extending away from the downward-sloping region.

16. An array of solar modules comprising:
a deck structure;
a plurality of solar modules mounted on the deck structure;
wherein each of the plurality of solar modules comprises:
one or more layers of polymer;
one or more photovoltaic cells over a first region of the one or more layers of polymer; and
a transparent front sheet, a backsheet, and a layer of alternating sections of a rigid or semi-rigid polymer and a thermoplastic;
wherein the one or more layers of polymer are curved in at least a second region outside of the first region of the one or more photovoltaic cells, and wherein the layer of alternating sections is alternating between the rigid or semi-rigid polymer and the thermoplastic in a direction from the first region to the second region; and
wherein the layer of alternating sections includes at least a first section of the rigid or semi-rigid polymer for the first region and a first section of the thermoplastic for the second region where the one or more layers of polymer are curved; and
wherein the layer of alternating sections is sandwiched between a first thermoplastic layer and a second thermoplastic layer.

17. The array of solar modules of claim 16, wherein each of the plurality of solar modules comprises a first flat region, a vertical region rising from the first flat region, a downward-sloping region of the first region sloping away from the vertical region and including the one or more photovoltaic cells, and a second flat region extending away from the downward-sloping region, and wherein the layer of alternating sections of each of the plurality of solar modules comprises:
a respective rigid section for each of the first flat region, the downward-sloping region, and the second flat region; and
a respective thermoplastic section for each of:
a first junction between the first flat region and the downward-sloping region; and
a second junction between the down-ward sloping region and the second flat region.

18. The array of solar modules of claim 17, wherein each of the plurality of solar modules comprises a second vertical region rising from the second flat region, a second downward-sloping region sloping away from the second vertical region and including a plurality of additional photovoltaic cells, and a third flat region extending away from the second downward-sloping region.

19. The array of solar modules of claim 17, wherein, for each of the plurality of solar modules, a first angle between the first flat region and the vertical region is less than 90 degrees, and wherein a second angle between the vertical region and the downward-sloping region is less than 90 degrees.

20. The array of solar modules of claim 16, wherein each of the plurality of solar modules comprises a first flat region, an upward-sloping region sloping upwards from the first flat region and including a first subset of the one or more photovoltaic cells, a downward-sloping region sloping downwards from the upward-sloping region and including a second subset of the one or more photovoltaic cells, and a second flat region extending away from the downward-sloping region.

* * * * *